United States Patent
Phillips et al.

(10) Patent No.: US 8,369,803 B2
(45) Date of Patent: Feb. 5, 2013

(54) POWER CORRECTION MODULE FOR POWER AMPLIFIERS

(75) Inventors: Kerry B. Phillips, Haverhill, MA (US); Michael L. Hageman, Mount Vernon, IA (US); Robert M. Fisher, Center Point, IA (US); Paul R. Andrys, Swisher, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 169 days.

(21) Appl. No.: 12/813,571

(22) Filed: Jun. 11, 2010

(65) Prior Publication Data

US 2010/0248657 A1    Sep. 30, 2010

Related U.S. Application Data

(62) Division of application No. 11/895,725, filed on Aug. 27, 2007, now Pat. No. 7,937,049.

(60) Provisional application No. 60/850,324, filed on Oct. 6, 2006.

(51) Int. Cl.
*H01Q 11/12* (2006.01)
*H04B 1/04* (2006.01)

(52) U.S. Cl. .......... 455/126; 455/114.2; 455/127.1

(58) Field of Classification Search .... 455/114.2–114.3, 455/126, 127.1
See application file for complete search history.

(56) References Cited

U.S. PATENT DOCUMENTS

| | | | |
|---|---|---|---|
| 6,064,267 A | 5/2000 | Lewyn | |
| 6,566,944 B1 | 5/2003 | Pehlke et al. | |
| 6,642,784 B2 | 11/2003 | McMorrow | |
| 7,027,789 B2 | 4/2006 | Ammar | |
| 7,103,029 B1 * | 9/2006 | Minowa | 370/342 |
| 7,109,897 B1 | 9/2006 | Levesque | |
| 7,440,731 B2 | 10/2008 | Staudinger | |
| 7,460,842 B2 | 12/2008 | Black et al. | |
| 2001/0030580 A1 | 10/2001 | Canyon et al. | |
| 2006/0038710 A1 | 2/2006 | Staszewski et al. | |

* cited by examiner

*Primary Examiner* — Christian Hannon
(74) *Attorney, Agent, or Firm* — Knobbe, Martens, Olson and Bear, LLP

(57) ABSTRACT

A power correction module for use with an amplifier driving a load impedance is configured to sample the supply current and to cause a change in a control voltage, which corrects the supply voltage in response to a change in the load impedance. The supply voltage is corrected to cause the power amplifier to have a substantially constant output power. The power correction module is further configured to output a corrected peak voltage determined by an average value of the supply current.

20 Claims, 4 Drawing Sheets

POWER CORRECTION MODULE FOR POWER AMPLIFIERS

This is a divisional of U.S. patent application Ser. No. 11/895,725, filed Aug. 27, 2007, now U.S. Pat. No. 7,937,049 entitled "Output Power Correction Module for Amplifiers in Transmitters," and the benefit of and priority to that application and a provisional patent application entitled "Power Correction Module for Power Amplifiers," Ser. No. 60/850,324, filed on Oct. 6, 2006, is hereby claimed, and the disclosures of which are hereby incorporated fully by reference into the present application.

BACKGROUND OF THE INVENTION

1. Field of the Invention

The present invention relates to the field of electrical circuits. More particularly, the invention relates to amplifier circuits.

2. Background Art

Power amplifiers, such as saturated power amplifiers, used in communications devices, such as mobile telephones, are required to operate under wide variations in load impedance. Under these variations in load impedance, it is highly desirable for power amplifiers, such as saturated power amplifiers, to maintain a constant output power. It is also highly desirable for power amplifiers in transmitter systems utilizing predistortion for complex data modulations, such as data modulations utilized in the Enhanced Data Rates for GSM Evolution (EDGE) communications standard, to maintain a constant output power under load impedance variations. As a result, various techniques have been employed in an attempt to control the output power of a power amplifier.

However, conventional techniques for controlling the output power of a power amplifier suffer various disadvantages. For example, techniques that indirectly control the output power by controlling the voltage or current, such as collector voltage or collector current, supplied to the power amplifier provide adequate compensation for variations in operating conditions, such as variations in temperature and supply voltage, but undesirably allow significant variations in power delivered to a varying load. For example, in the voltage or current control techniques discussed above, the power delivered to the load by the power amplifier can vary by as much as 10.0 decibels (dB) as the impedance of the load changes.

In another conventional approach, a constant DC power is delivered to a power amplifier, such as a saturated power amplifier, by utilizing a feedback loop to adjust the collector voltage of the power amplifier. Since the power amplifier output power is equal to the product of the DC power and the collector efficiency, this approach can provide a constant output power if constant collector efficiency is maintained. However, this approach presents significant problems in transmitter systems utilizing predistortion, such as transmitter systems utilizing polar EDGE modulation.

SUMMARY OF THE INVENTION

An output power correction module for amplifiers in transmitters, substantially as shown in and/or described in connection with at least one of the figures, as set forth more completely in the claims.

DETAILED DESCRIPTION OF THE INVENTION

The present invention is directed to an output power correction module for amplifiers in transmitters. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention provides an innovative power correction module for correcting output power of a power amplifier in a transmitter system under variations in load impedance. Although a transmitter system utilizing polar modulation, such as polar EDGE modulation—which requires predistortion and provides both phase and amplitude modulation—is utilized to illustrate the present invention, the present invention can also be applied in a transmitter system in which amplitude modulation or predistortion are not utilized.

Figure 1:
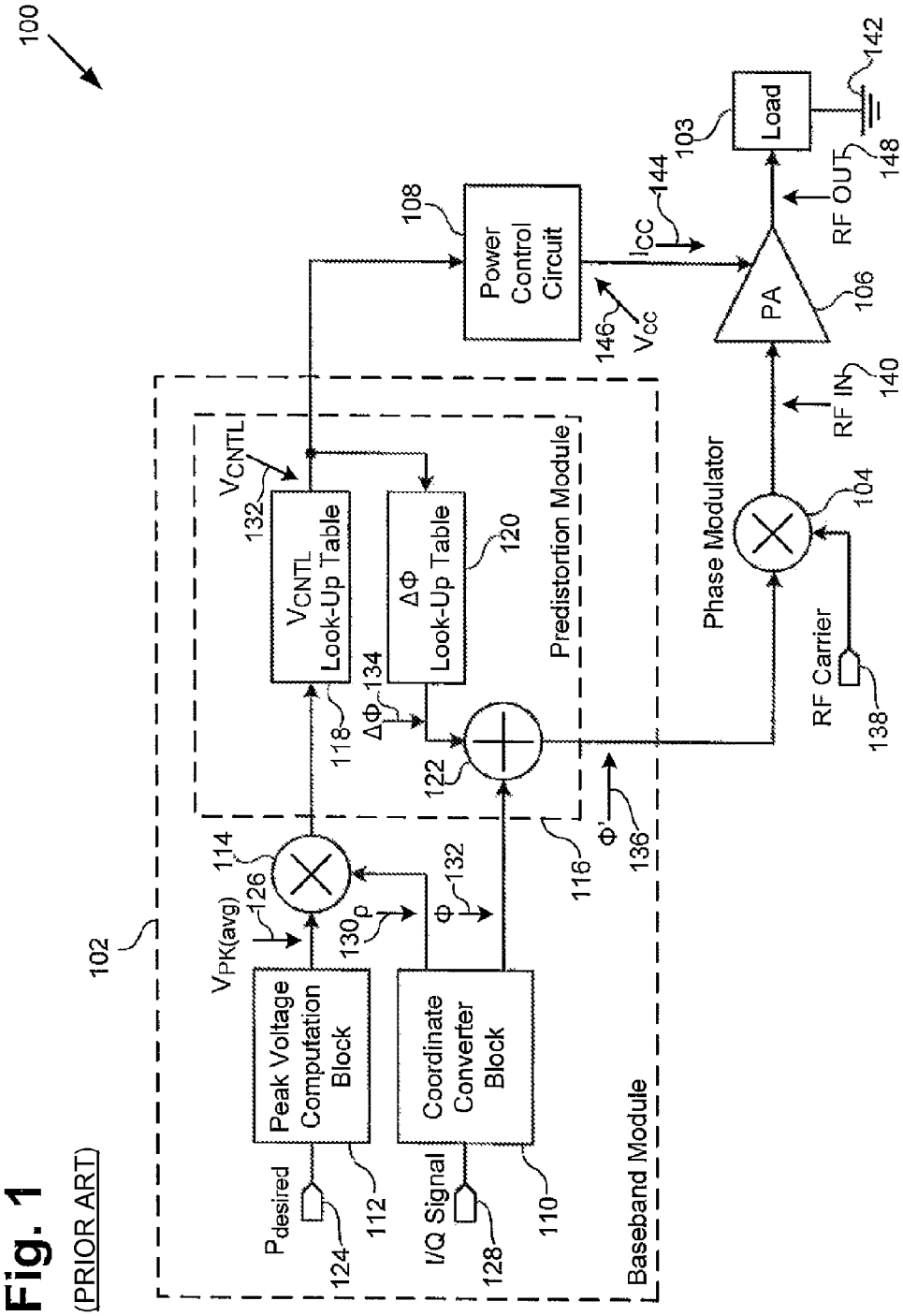
FIG. 1 is a block diagram of an exemplary conventional transmitter system.

FIG. 1 shows a block diagram of an exemplary conventional transmitter system coupled to a load. Certain details and features have been left out of FIG. 1, which are apparent to a person of ordinary skill in the art. Conventional transmitter system 100, which is coupled to load 103, includes baseband module 102, phase modulator 104, power amplifier 106, and power control circuit 108. Baseband module 102 includes coordinate converter block 110, peak voltage computation block 112, multiplication element 114, and predistortion module 116, which includes control voltage ($V_{CNTL}$) look-up table 118, phase shift ($\Delta\Phi$) look-up table 120, and summation element 122. Conventional transmitter system 100 can be utilized in a wireless communications device, such as a mobile telephone, that can utilize a communications standard, such as an EDGE communications standard. Conventional transmitter system 100 can also utilize polar modulation, such as polar EDGE modulation, which utilizes predistortion.

As shown in FIG. 1, desired average output power ($P_{desired}$) 124, which is a desired average output power of power amplifier 106, is coupled to the input of peak voltage computation block 112 and the output of peak voltage computation block 112 is coupled to an input of multiplication element 114. Peak voltage computation block 112 can be configured to receive $P_{desired}$ 124, compute a corresponding average peak voltage ($V_{PK(avg)}$) corresponding to $P_{desired}$ 124, and output $V_{PK(avg)}$ (indicated by arrow 126) to multiplication element 114. Also shown in FIG. 1, I/Q signal 128, which can be utilized to provide amplitude and phase modulation information, is coupled to the input of coordinate converter block 110 and the respective outputs of coordinate converter block 110 are coupled to inputs of multiplication element 114 and summation element 122. Coordinate converter block 110 can be configured to receive I/Q signal 128, convert I/Q signal 128 from Cartesian coordinates (I, Q) to polar coordinates (ρ, Φ), where "ρ" is an ideal amplitude modulation component and "Φ" is an ideal phase modulation component, to filter the resulting signal, and to output ρ (indicated by arrow 130) and Φ (indicated by arrow 132) to respective inputs of multiplication element 114 and summation element 122. The conversion from Cartesian coordinates (I, Q) to polar coordinates (ρ, Φ) can be performed by, for example, a baseband processor, which is not shown in FIG. 1.

Further shown in FIG. 1, the output of multiplication element 114 is coupled to the input of $V_{CNTL}$ look-up table 118 and the output of $V_{CNTL}$ look-up table 118 is coupled to the inputs of ΔΦ look-up table 120 and power control circuit 108. Multiplication element 114 can be configured to receive $V_{PK(avg)}$ and ρ, form the product of ρ and $V_{PK(avg)}$ (ρ●$V_{PK(avg)}$), and to output ρ●$V_{PK(avg)}$ to $V_{CNTL}$ look-up table 118. $V_{CNTL}$ look-up table 118 can be configured to receive the product of ρ●$V_{PK(avg)}$ and to determine a corresponding predistorted control voltage ($V_{CNTL}$), and to output $V_{CNTL}$ (indicated by arrow 132) to ΔΦ look-up table 120 and power control circuit 108. Also shown in FIG. 1, the output of ΔΦ look-up table 120 is coupled to an input of summation element 122 and the output of summation element 122 is coupled to an input of phase modulator 104. ΔΦ look-up table 120 can be configured to receive $V_{CNTL}$ from $V_{CNTL}$ look-up table 118, utilize $V_{CNTL}$ to determine an appropriate amount of phase shift (ΔΦ) corresponding to $V_{CNTL}$ to apply to the ideal phase modulation component, i.e., Φ, and to output ΔΦ (indicated by arrow 134) to an input of summation element 122. $V_{CNTL}$, look-up table 118 and ΔΦ look-up table 120 can be formed during a calibration procedure for a communications device, such as a mobile telephone, in which transmitter system 100 resides.

Summation element 122 can be configured to form the sum of ΔΦ and Φ to form a predistorted phase modulation component (Φ'), and to output Φ' (indicated by arrow 136) to an input of phase modulator 104. Further shown in FIG. 1, RF carrier 138 is coupled to an input of phase modulator 104 and the output of phase modulator 104 is coupled to the signal input of power amplifier 106. Phase modulator 104 can be a polar modulator, such as an EDGE polar modulator, and can be configured to modulate RF carrier 138 with Φ' and to output a phase modulated RF signal, i.e., RF IN 140, which is coupled to the signal input of power amplifier 106. Also shown in FIG. 1, the output of power control circuit 108 is coupled to a supply voltage input, i.e., a collector voltage input, of power amplifier 106 and load 103 is coupled between the output of power amplifier 106 and ground 142. Power control circuit 108 can be configured to receive $V_{CNTL}$, i.e., a predistorted control voltage, from $V_{CNTL}$ look-up table 118 in predistortion module 116 and to provide a collector current ($I_{CC}$) (indicated by arrow 144) and a collector voltage ($V_{CC}$) (indicated by arrow 146), to power amplifier 106. Power control circuit 108 can include a linear regulator (not shown in FIG. 1) such that $V_{CC}$ is linearly related to $V_{CNTL}$.

Power amplifier 106 can be a saturated power amplifier and can be configured to receive RF IN 140, which is a phase-modulated RF signal provided by phase modulator 104, to combine the predistorted phase and amplitude modulation components at the collector of power amplifier 106, and to output an RF signal, i.e., RF OUT 148, having accurate phase and amplitude modulation. Load 103, which can be, for example, an antenna, can provide a load impedance between the output of power amplifier 106 and ground 142. The load impedance provided by load 103 can be designed to be, for example, 50.0 ohms. However, under adverse voltage standing wave ratio (VSWR) conditions, the load impedance presented to power amplifier 106 by load 103 can vary significantly from an ideal designed load impedance, such as a 50.0 ohm load impedance.

When the load impedance presented to power amplifier 106 varies, the output power provided by power amplifier 106 also varies. However, $V_{CNTL}$, which determines $V_{CC}$, is not corrected for a change in the load impedance. Thus, conventional transmitter system 100 does not provide correction for variations in load impedance. Therefore, the output power provided by power amplifier 106 in conventional transmitter system 100 can vary during variations in the load impedance of load 103.

Figure 2:
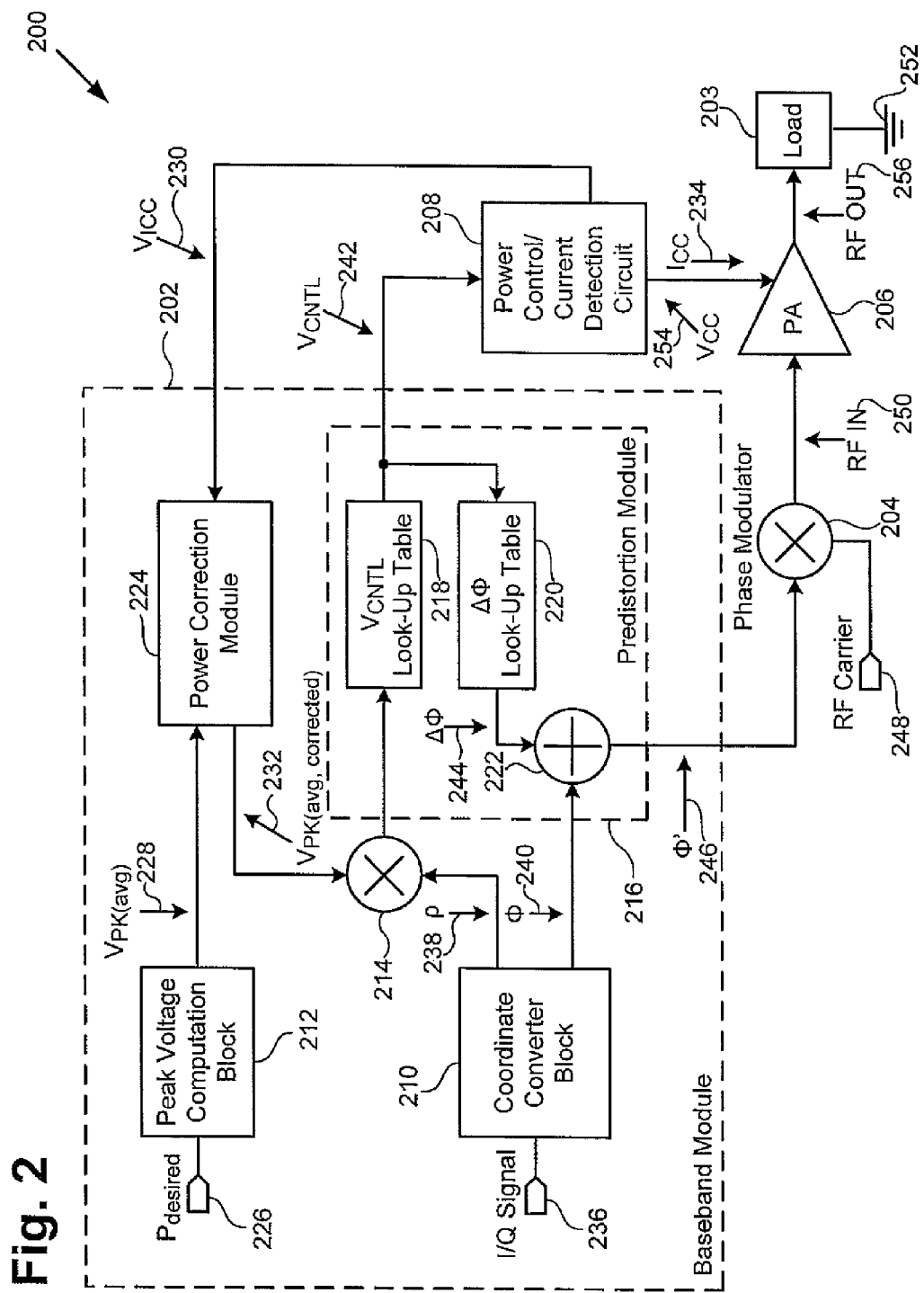
FIG. 2 is a block diagram of an exemplary transmitter system including an exemplary power correction module in accordance with one embodiment of the present invention.

FIG. 2 shows a block diagram of an exemplary transmitter system coupled to a load in accordance with one embodiment of the present invention. Certain details and features have been left out of FIG. 2, which are apparent to a person of ordinary skill in the art. Transmitter system 200, which is coupled to load 203, includes baseband module 202, phase modulator 204, power amplifier 206, and power control/current detection circuit 208. Baseband module 202 includes coordinate converter block 210, peak voltage computation block 212, multiplication element 214, power correction module 224, and predistortion module 216, which includes control voltage ($V_{CNTL}$) look-up table 218, phase shift (ΔΦ) look-up table 220, and summation element 222. Transmitter system 200 can be utilized in communications devices, such as mobile telephones, that utilize an EDGE communications standard or other suitable communications standards. Transmitter system 200 can utilize, for example, open-loop polar EDGE modulation, which utilizes predistortion. However, transmitter system 200 can also utilize other types of polar modulation.

As shown in FIG. 2, desired average output power ($P_{desired}$) 226, which is a desired output power of power amplifier 206, is coupled to the input of peak voltage computation block 212 and the output of peak voltage computation block 212 is coupled to an input of power control module 224. Peak voltage computation block 212 can be configured to receive $P_{desired}$ 226, to compute an average peak voltage ($V_{PK(avg)}$) corresponding to $P_{desired}$ 226, and to output $V_{PK(avg)}$ (indicated by arrow 228) to an input of power correction module 224. Also shown in FIG. 2, an output of power control/current detection circuit 208 is coupled to an input of power correction module 224 and the output of power correction module 224 is coupled to an input of multiplication element 214. Power correction module 224 can be configured to receive $V_{PK(avg)}$ from peak voltage computation block 212 and $V_{ICC}$ (indicated by arrow 230) from power control/current detection circuit 208, to determine a corrected average peak voltage ($V_{PK(avg, corrected)}$) by adjusting $V_{PK(avg)}$ by a correction factor (k), and to output $V_{PK(avg, corrected)}$ (indicated by arrow 232).

The correction factor, i.e., k, can be determined from the equation:

$$k = \sqrt{\frac{I_{CC(ideal)}}{I_{CC(measured)}}} \quad \text{equation (1)}$$

where "$I_{CC(ideal)}$" is the ideal collector current that power amplifier 206 should draw from power control/current detection circuit 208 for a desired average peak voltage, i.e., $V_{PK(avg)}$, corresponding to the desired output power, i.e., $P_{desired}$ 226, of power amplifier 206, and where "$I_{CC(measured)}$" is a measured average value of the collector current, i.e., $I_{CC}$ (indicated by arrow 234), drawn by power amplifier 206. $I_{CC(measured)}$ can be determined from $V_{ICC}$, which is a feedback voltage that is substantially proportional to $I_{CC}$, i.e., the actual collector current drawn by amplifier 206. Thus, by receiving $V_{ICC}$, power correction module is sampling $I_{CC}$. An embodiment of the invention's power correction module is further discussed below in relation to FIG. 3.

Further shown in FIG. 2, I/Q signal 236 is coupled to the input of coordinate converter block 210 and the respective outputs of coordinate converter block 210 are coupled to multiplication element 214 and summation element 222. I/Q signal 236 can be utilized to provide phase and amplitude modulation information. Coordinate converter block 210 can be configured to receive I/Q signal 236, convert I/Q signal 236 from Cartesian coordinates (I, Q) to polar coordinates (ρ, Φ), where "ρ" is an ideal amplitude modulation component and "Φ" is an ideal phase modulation component, to filter the signal, and to provide ρ (indicated by arrow 238) at one output and to output Φ (indicated by arrow 240) at the other output. The conversion from Cartesian coordinates (I, Q) to polar coordinates (ρ, Φ) can be performed by, for example, a baseband processor (not shown in FIG. 2) in baseband module 202.

Further shown in FIG. 2, the output of multiplication element 214 is coupled to the input of $V_{CNTL}$ look-up table 218 and the output of $V_{CNTL}$ look-up table 218 is coupled to the inputs of ΔΦ look-up table 220 and power control/current detection module 208. Multiplication element 214 can be configured to receive $V_{PK\,(avg,\,corrected)}$ from power correction module 224 and ρ from coordinate converter block 210, to form the product of ρ and $V_{PK\,(avg,\,corrected)}$ (ρ●$V_{PK\,(avg,\,corrected)}$), and to output ρ●$V_{PK\,(avg,\,corrected)}$ to the input of $V_{CNTL}$ look-up table 218. $V_{CNTL}$ look-up table 218 can be configured to receive ρ ●$V_{PK\,(avg,\,corrected)}$ from multiplication element 214, to determine a control voltage ($V_{CNTL}$) corresponding to ρ ●$V_{PK\,(avg,\,corrected)}$ by utilizing an appropriate look-up table, and to output $V_{CNTL}$ (indicated by arrow 242) to the inputs of ΔΦ look-up table 220 and power control/current detection circuit 208.

Also shown in FIG. 2, the output of ΔΦ look-up table 220 is coupled to an input of summation element 222 and the output of summation element 222 is coupled to an input of phase modulator 204. ΔΦ look-up table 220 can be configured to receive $V_{CNTL}$ from $V_{CNTL}$ look-up table 218, to determine an amount of phase shift (ΔΦ) to add to Φ, i.e., the ideal phase component, corresponding to $V_{CNTL}$ by utilizing an appropriate look-up table, and to output ΔΦ (indicated by arrow 244) to an input of summation element 222. The look-up tables in $V_{CNTL}$ look-up table 218 and ΔΦ look-up table 220 can be formed during a calibration procedure for a communications device, such as a mobile telephone, in which transmitter system 200 resides. Summation element 222 can be configured to receive Φ from coordinate converter block 210 and ΔΦ from ΔΦ look-up table 220, to add Φ and ΔΦ to form Φ', i.e., a predistorted phase modulation component, and to output Φ' (indicated by arrow 246) to an input of phase modulator 204.

Also shown in FIG. 2, RF carrier 248 is coupled to an input of phase modulator 204 and the output of phase modulator 204 is coupled to the signal input of power amplifier 206. Phase modulator 204 can be, for example, a polar modulator, such as an EDGE polar modulator, and can be configured to receive Φ' from summation element 222 and RF carrier 248, to phase modulate RF carrier 248 with Φ', and to output a phase modulated RF signal (RF IN 250) to the signal input of power amplifier 206. Further shown in FIG. 2, the output of power control/current detection circuit 208 is coupled to a supply voltage input, i.e., a collector voltage input, of power amplifier 206 and load 203 is coupled between the output of power amplifier 206 and ground 252.

Power control/current detection circuit 208 can be configured to receive $V_{CNTL}$, which is a predistorted control voltage, from $V_{CNTL}$ look-up table 218, to provide a supply voltage ($V_{CC}$) (indicated by arrow 254) and a supply current ($I_{CC}$) (indicated by arrow 234) to power amplifier 206, and to provide $V_{ICC}$ (indicated by arrow 230) to power correction module 224. In power control/current detection circuit 208, $V_{ICC}$ is proportional to $I_{CC}$ and $V_{CC}$ is linearly proportional to $V_{CNTL}$. An exemplary power control/current detection circuit is further discussed below in relation to FIG. 4.

Power amplifier 206 can be a saturated power amplifier and can be configured to receive RF IN 250, which is a phase-modulated RF signal, from phase modulator 204, and $V_{CC}$, which is a predistorted amplitude modulated supply voltage, from power control/current detection circuit 208, to combine the predistorted phase and amplitude components at the collector of the power amplifier, and to output an RF signal, i.e., RF OUT 256, having accurate phase and amplitude modulation. Load 203, which can be, for example, an antenna, has a load impedance, which is provided between the output of power amplifier 206 and ground 252. The load impedance of load 203 can be designed to be, for example, approximately equal to 50.0 ohms. However, the load impedance of load 203 can also be designed to be different than 50.0 ohms.

The operation of transmitter system 200 will now be discussed. Under adverse VSWR conditions, the load impedance presented to power amplifier 206 by load 203 can significantly vary from a designed "ideal" load impedance, which can be, for example, approximately 50.0 ohms. As the load impedance changes, $I_{CC}$ i.e., the supply current drawn by power amplifier 206, will also change. In the present embodiment, $V_{ICC}$, which is proportional to $I_{CC}$, is provided by power control/current detection circuit 208 and coupled to power correction module 224 to provide a sample of $I_{CC}$. In power correction module 224, $V_{ICC}$ can be integrated over a predetermined time period to determine an integrated value of $V_{ICC}$, which can be utilized to determine an average value of $I_{CC}$, i.e. $I_{CC(measured)}$. By utilizing a known ideal collector current for the desired average peak voltage, i.e., $V_{PK(avg)}$, a correction factor (k) can be determined and utilized to adjust $V_{PK(avg)}$ for the load impedance of load 203.

The corrected average peak voltage, i.e., $V_{PK(avg,\,corrected)}$ can be output by power correction module 224, combined with the amplitude modulation component, i.e., ρ, and input into $V_{CNTL}$ look-up table 218. $V_{CNTL}$ look-up table 218 provides a corresponding control voltage, i.e., $V_{CNTL}$, which is predistorted to correct for nonlinearities between $V_{CC}$ and the RF output voltage and is input into power control/current detection circuit 208. $V_{CNTL}$, which is amplitude modulated and corrected for load impedance, is utilized to determine $V_{CC}$, which is applied to power amplifier 206. $V_{CNTL}$, is also input into ΔΦ look-up table 220 to determine an appropriate amount of phase (ΔΦ) to add to the ideal phase modulation component Φ to correct for excess phase that can be introduced by modulating the collector voltage. After the phase is predistorted, it is modulated onto RF carrier 248 in phase modulator 204 to form RF IN 250, which is applied to the signal input of power amplifier 206. The predistorted phase and amplitude modulation components are combined at the collector of power amplifier 206 is produce RF OUT 256, which is a linear output signal having accurate phase and amplitude modulation.

By correcting $V_{CNTL}$ for variations in load impedance, $V_{CC}$, which is determined by $V_{CNTL}$ is also corrected for load impedance variations. DC power ($P_{DC}$) is substantially equal to $V_{CC} \bullet I_{CC}$ and output power ($P_{RF}$) is substantially equal to $P_{DC} \bullet \eta$, which is the collector efficiency of power amplifier 206. By providing substantially constant collector efficiency under variations in load impedance, the present invention can provide a substantially constant power amplifier output power under a varying load impedance.

Thus, by utilizing a feedback loop including power control/current detection circuit 208, power correction module 224, multiplication element 214, and predistortion module 216 and by providing a substantially constant collector efficiency, an embodiment of the present invention can provide output power correction for variations in load impedance at the output of power amplifier 206 so as to provide a substantially constant power output. In contrast, conventional transmitter system 100 does not provide output power correction for changes in load impedance. As a result, the output power provided by power amplifier 106 in conventional transmitter system 100 can undesirably vary under variations in load impedance.

Also, since load impedance variations typically occur very slowly compared to the modulation bandwidth of transmitter system 200, the feedback control loop provided by the present invention for correcting output power for variations in load impedance can be a relatively slow control loop. As a result, polar modulation in transmitter system 200 can operate in an essentially open-loop condition. Thus, the present invention eliminates the need for high-speed circuitry in the feedback loop, thereby reducing manufacturing cost.

Additionally, since the present invention provides the baseband module, e.g., baseband module 202, with collector current information, over-current protection can be implemented in software, if desired.

Figure 3:
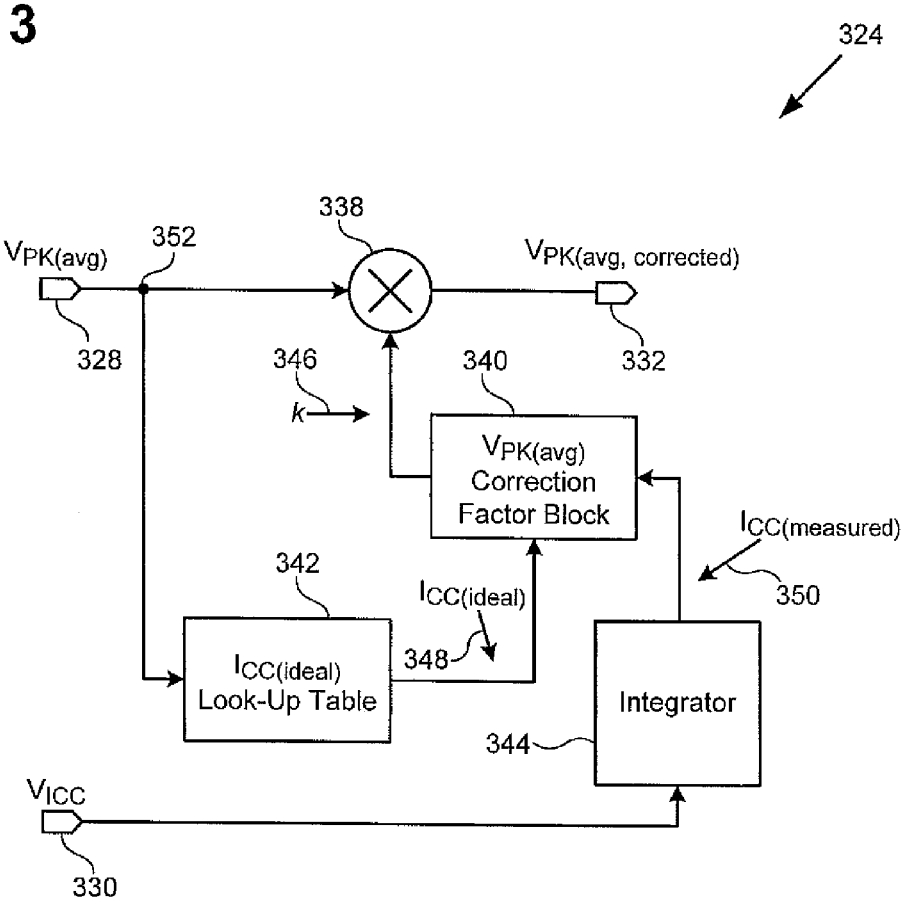
FIG. 3 is a block diagram of an exemplary power correction module in accordance with one embodiment of the present invention.

FIG. 3 shows a block diagram of an exemplary power correction module in accordance with one embodiment of the present invention. In FIG. 3, power correction module 324 corresponds to power correction module 224 in transmitter system 200 in FIG. 2. Also, $V_{PK(avg)}$ 328, $V_{ICC}$ 330, and $V_{PK(avg,\ corrected)}$ 332 in FIG. 3 correspond, respectively, to $V_{PK(avg)}$ (indicated by arrow 228), $V_{ICC}$ (indicated by arrow 230), and $V_{PK(avg,\ corrected)}$ (indicated by arrow 232) in FIG. 2. Power correction module 324 includes multiplication element 338, $V_{PK(avg)}$ Correction Factor Block 340 (hereinafter referred to simply as "correction factor block 340"), $I_{CC(ideal)}$ Look-Up Table 342, and integrator 344. Power correction module 324 can be configured to receive $V_{PK(avg)}$ 328, which is an average peak voltage that is desired at the output of power amplifier 206 in FIG. 2, and $V_{ICC}$ 330, which is a feedback voltage that is proportional to $I_{CC}$, to determine k, which is a correction factor for adjusting the average peak voltage in response to a change in load impedance of load 203, and to output $V_{PK(avg,\ corrected)}$ 332, which is a corrected average peak voltage.

As shown in FIG. 3, $V_{ICC}$ 330 is coupled to the input of integrator 344 and the output of integrator 344 is coupled to an input of correction factor block 340. Integrator 344 can be configured to receive $V_{ICC}$ 330, which is a feedback voltage from power control/current detection circuit 208 that corresponds to a sample of the supply current ($I_{CC}$) drawn by power amplifier 206, integrate $V_{ICC}$ 330 over a selected time period, to determine an average value of $I_{CC}$, i.e., $I_{CC(measured)}$, from the integrated value of $V_{ICC}$ 330, and to output $I_{CC(measured)}$ (indicated by arrow 350). Also shown in FIG. 3, $V_{PK(avg)}$ 328 is coupled to the input of $I_{CC(ideal)}$ Look-Up Table 342, the output of $I_{CC(ideal)}$ Look-Up Table 342 is coupled to an input of correction factor block 340, and the output of correction factor block 340 is coupled to an input of multiplication element 338.

$I_{CC(ideal)}$ Look-Up Table 342 can be configured to receive $V_{PK(avg)}$ 328, to determine an ideal collector current, i.e., a collector current that would be drawn by power amplifier 206 under a specified load impedance, such as a 50.0 ohm load impedance, corresponding to $V_{PK(avg)}$ 328, and to output $I_{CC(ideal)}$ (indicated by arrow 348). $I_{CC(ideal)}$ can be determined from a look-up table that can be generated during a calibration procedure for a communications device, such as a mobile telephone, in which transmitter system 200 resides. Correction factor block 340 can be configured to receive $I_{CC(measured)}$ and $I_{CC(ideal)}$, to determine k, a correction factor, from equation (1) discussed above, and to output k (indicated by arrow 346) to multiplication element 338.

Further shown in FIG. 3, $V_{PK(avg)}$ 328 is coupled to an input of multiplication element 338 and $V_{PK(avg,\ corrected)}$ 332 is output by multiplication element 338. Multiplication element 338 can be configured to receive $V_{PK(avg)}$ 328 and k, to determine the product of k and $V_{PK(avg)}$ 328, and to output a corrected average peak voltage, i.e., $V_{PK(avg,\ corrected)}$ 332.

Figure 4:
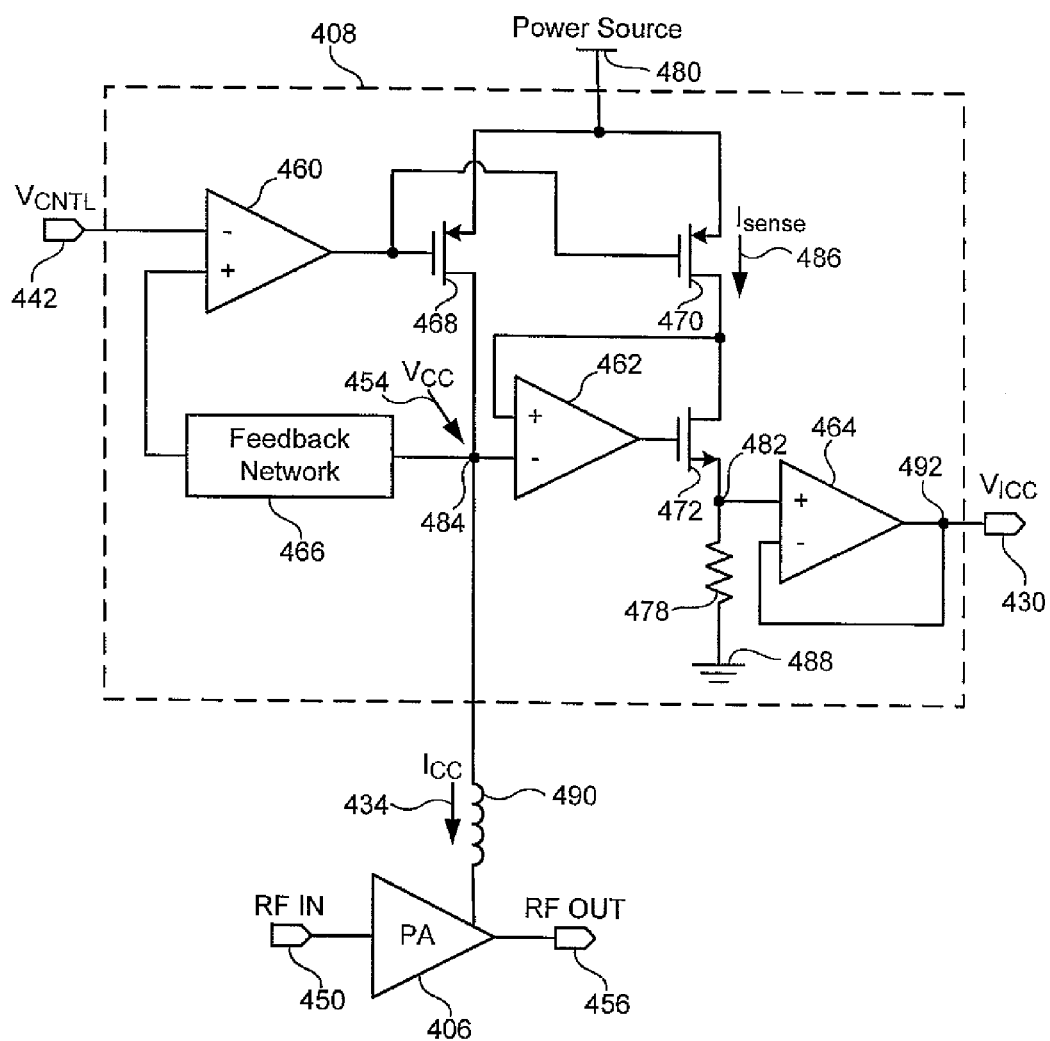
FIG. 4 illustrates a circuit diagram of an exemplary power control/current detection circuit in accordance with one embodiment of the present invention.

FIG. 4 shows a circuit diagram of an exemplary power control/current detection circuit coupled to an exemplary power amplifier in accordance with one embodiment of the present invention. In FIG. 4, power amplifier 406, power control/current detection circuit 408, $V_{ICC}$ 430, $I_{CC}$ (indicated by arrow 434), $V_{CNTL}$ 442, RF IN 450, $V_{CC}$ (indicated by arrow 454) and RF OUT 456 correspond, respectively, to power amplifier 206, power control/current detection circuit 208, $V_{ICC}$ (indicated by arrow 230), $I_{CC}$ (indicated by arrow 234), $V_{CNTL}$ (indicated by arrow 242), RF IN 250, $V_{CC}$ (indicated by arrow 254) and RF OUT 256 in FIG. 2. Power control/current detection circuit 408 includes operational amplifiers (op amp) 460, 462, and 464, feedback network 466, transistors 468, 470, and 472, and resistor 478. Transistors 468 and 470 can each be, for example, a p-channel field-effect transistor (PFET). Transistor 472 can be, for example, an n-channel FET (NFET).

As shown in FIG. 4, power control/current detection circuit 408 is coupled to power amplifier 406 by inductor 490, which can be, for example, an RF choke. Inductor 490 can prevent an RF signal in power amplifier 406 from entering power control/current detection circuit 408. Also shown in FIG. 4, $V_{CNTL}$ 442 is coupled to the negative terminal of op amp 460, feedback network 466 is coupled between the positive terminal of op amp 460 and the drain of transistor 468, the negative terminal of op amp 462 and a first terminal of inductor 490 at node 484, and a second terminal of inductor 490 is coupled to a supply voltage input of power amplifier 406. Node 484 has a voltage referred to herein as "$V_{CC}$" (indicated by arrow 454). Feedback network 466 can determine the gain of the linear regulator formed by op amp 460, feedback network 466, and transistor 468 and can be, for example, a resistive feedback network.

Also shown in FIG. 4, the output of op amp 460 is coupled to the gates of transistors 468 and 470 and the sources of transistors 468 and 470 are coupled to power source 480, which can be a DC power source, such as a battery. Further shown in FIG. 4, the positive terminal of op amp 462 is coupled to the drains of transistors 470 and 472, the output of op amp 462 is coupled to the gate of transistor 472, and the source of transistor 472 is coupled to the positive terminal of op amp 464 and a first terminal of resistor 478 at node 482. Also shown in FIG. 4, the second terminal of resistor 478 is coupled to ground 488 and the negative terminal of op amp 464 is coupled to the output of op amp 464 at node 492, which provides $V_{ICC}$ 430.

The function and operation of power control/current detection circuit 408 will now be discussed. Op amp 460, feedback network 466 and transistor 468 form a linear regulator that receives $V_{CNTL}$ 442 and provides a supply voltage, i.e., $V_{CC}$, for power amplifier 406 at node 484. Power amplifier 406 draws $I_{CC}$ (indicated by arrow 434), which is a supply current provided by power control/current detection circuit 408. $I_{CC}$, which is drawn from power source 480, is a large current that flows through transistor 468. The product of $V_{CC}$ and $I_{CC}$ determines the DC power provided to power amplifier 406. The current mirror formed by transistors 468 and 470, which are driven by op amp 460, provides a sense current ($I_{SENSE}$) (indicated by arrow 486), which flows through transistors 470 and 472. $I_{SENSE}$ is substantially equal to $I_{CC}/N$, where "N" is a mirror ratio and is determined by the size of transistor 468 with respect to the size of transistor 470.

Op amp 462 is utilized to cause the voltage drop across transistor 470 to be substantially equal to the voltage drop across transistor 468. In op amp 462, the voltage at the positive terminal, which is coupled to the drains of transistors 470 and 472, is constrained to be substantially equal to the voltage, i.e., $V_{CC}$, at the negative terminal of the op amp. Thus, op amp 462 forms a feedback loop to increase the accuracy of the current mirror formed by transistors 468 and 470. $I_{SENSE}$ flows through resistor 478 to ground 488, thereby causing $V_{ICC}$ to be formed at node 482. As a result of the current mirror formed by transistors 468 and 470, $V_{ICC}$ is proportional to $I_{CC}$, i.e., the collector current drawn by power amplifier 406. Op amp 464 is configured to operate as a unity gain buffer to provide a high impedance load on node 482 so as to prevent current from being drawn from node 482 and, thereby, altering the relationship between $V_{ICC}$ and $I_{CC}$. The negative terminal of op amp 464 is coupled to the output of op amp 464, thereby providing $V_{ICC}$ 430 at node 492.

A change in a load impedance of a load, such as load 203 in FIG. 2, coupled to the output of power amplifier 406 can cause a corresponding change in $I_{CC}$, which is the supply current drawn by power amplifier 406. A change in $I_{CC}$ can cause a corresponding change in $V_{ICC}$ 430, which is proportional to $I_{CC}$. In the present embodiment, $V_{ICC}$ 430 forms a feedback voltage that can be utilized to sample $I_{CC}$. By utilizing a feedback loop including power correction module 224, multiplication element 214, and predistortion module 216 in baseband module 202 in FIG. 2, $V_{CNTL}$ 442 can be adjusted to compensate for the change in $I_{CC}$ caused by a change in load impedance. Since $V_{CNTL}$ 442 determines $V_{CC}$, the present invention can cause an appropriate change in $V_{CC}$ so as to advantageously provide a substantially constant power at the output of power amplifier 406 under load impedance variations.

Thus, by utilizing a power correction module in a feedback loop to sample collector current drawn by a power amplifier, the present invention provides power amplifier output power correction under variations in load impedance. As a result, the present invention can advantageously provide a substantially constant power amplifier output power under load impedance variations. Additionally, the present invention can provide a substantially constant output power while advantageously performing predistortion, which is required in transmitter systems using a modulation such as open-loop polar EDGE modulation.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an output power correction module for amplifiers in transmitters has been described.

The invention claimed is:

1. A power correction module for use with an amplifier driving a load impedance, said power correction module comprising:
    an integrator configured to generate an average value of a supply current of said amplifier in response to changes in said load impedance;
    look-up table configured to receive a peak voltage and to determine an ideal value of said supply current; and
    a correction factor block configured to receive said average value of said supply current and to provide a correction factor, said correction factor being utilized to correct a supply voltage of said amplifier, and said correction factor being substantially equal to a square root of a ratio of said ideal value of said supply current over said average value of said supply current.

2. A power correction module for use with an amplifier driving a load impedance, said power correction module comprising:
    an integrator configured to generate an average value of a supply current of said amplifier in response to changes in said load impedance, said integrator utilizing a feedback voltage that is proportional to said supply current and to generate said average value of said supply current; and
    a correction factor block configured to receive said average value of said supply current and to provide a correction factor, said correction factor being utilized to correct a supply voltage of said amplifier.

3. A power correction module for use with an amplifier driving a load impedance, said power correction module comprising:
    an integrator configured to generate an average value of a supply current of said amplifier in response to changes in said load impedance, said amplifier being utilized as a power amplifier in a transmitter system, and said transmitter system utilizing polar EDGE modulation; and
    a correction factor block configured to receive said average value of said supply current and to provide a correction factor, said correction factor being utilized to determine a control voltage, and said control voltage being utilized to correct a supply voltage of said amplifier.

4. A power correction module for use with an amplifier driving a load impedance, said power correction module comprising:

an integrator configured to generate an average value of a supply current of said amplifier in response to changes in said load impedance, said amplifier being utilized as a power amplifier in a transmitter system, said transmitter system including a predistortion module configured to determine a control voltage for correcting a supply voltage from a product of a corrected peak voltage and an amplitude modulation component and to output said control voltage for correcting the supply voltage of said amplifier; and a correction factor block configured to receive said average value of said supply current and to provide a correction factor represented by said corrected peak voltage, said correction factor being utilized to determine said control voltage, and said control voltage being utilized to correct said supply voltage of said amplifier.

5. The power correction module of claim 4 wherein said transmitter system includes a phase modulator configured to receive a predistorted phase modulation component from said predistortion module and to provide a phase modulated RF input signal to said power amplifier.

6. The power correction module of claim 4 wherein said transmitter system further includes a multiplication element configured to receive said corrected peak voltage and said amplitude modulation component and to output said product of said corrected peak voltage and said amplitude modulation component.

7. The power correction module of claim 4 wherein the correction factor varies inversely with a square root of said average value of said supply current.

8. The power correction module of claim 1 wherein the amplifier is configured to provide a substantially constant output power in response to the changes in said load impedance.

9. The power correction module of claim 1 wherein the correction block is further configured to determine a corrected peak voltage, the corrected peak voltage being determined based at least partially on the correction factor.

10. The power correction module of claim 1 wherein the amplifier is utilized as a power amplifier in a transmitter system, the transmitter system including a predistortion module configured to output a control voltage used to correct the supply voltage of the amplifier.

11. The power correction module of claim 10 further comprising a power control/current detection circuit configured to output the supply voltage and the supply current to the amplifier in response to the control voltage and to produce a feedback voltage indicating the supply current drawn by the amplifier.

12. The power correction module of claim 3 further comprising a multiplication element configured to receive the correction factor and a peak voltage and to output a corrected peak voltage.

13. The power correction module of claim 2 wherein the correction factor is substantially equal to a square root of a ratio of an ideal value of said supply current over said average value of said supply current, the ideal value of said supply current being determined based at least partially on a peak voltage.

14. The power correction module of claim 2 wherein the amplifier is utilized as a power amplifier in a transmitter system, the transmitter system including a predistortion module configured to output a control voltage used to correct the supply voltage of the amplifier.

15. The power correction module of claim 14 further comprising a power control/current detection circuit configured to output the supply voltage and the supply current to the amplifier in response to the control voltage, said power control/current detection circuit comprising a first and a second transistor configured as a current mirror for providing a sense current, said sense current causing said feedback voltage to be substantially proportional to said supply current.

16. The power correction module of claim 3 further comprising a look-up table configured to output an ideal value of said supply current, the correction factor block being further configured to determine the correction factor based on said ideal value of said supply current.

17. The power correction module of claim 3 wherein the correction factor depends at least partially on a square root of an ideal value of said supply current.

18. The power correction module of claim 3 wherein the transmitter system includes a predistortion module configured to output the control voltage.

19. The power correction module of claim 18 further comprising a power control/current detection circuit configured to output the supply voltage and the supply current to the amplifier in response to the control voltage and to produce a feedback voltage indicating the supply current drawn by the amplifier.

20. The power correction module of claim 19 wherein the predistortion module is configured to determine said control voltage from a product of a corrected peak voltage and an amplitude modulation component and to output said control voltage to said power control/current detection circuit.

* * * * *

UNITED STATES PATENT AND TRADEMARK OFFICE
CERTIFICATE OF CORRECTION

PATENT NO. : 8,369,803 B2  
APPLICATION NO. : 12/813571  
DATED : February 5, 2013  
INVENTOR(S) : Phillips et al.

Page 1 of 1

It is certified that error appears in the above-identified patent and that said Letters Patent is hereby corrected as shown below:

In the Specification

In column 3 at line 34, Change "$V_{CNTL}$," to --$V_{CNTL}$--.

In column 3 at line 35, Change "$V_{CNTL}$," to --$V_{CNTL}$--.

In column 3 at line 39, Change "$V_{CNTL}$," to --$V_{CNTL}$--.

In column 5 at line 39, Change "$V_{CNTL}$," to --$V_{CNTL}$--.

In column 6 at line 46, Change "$I_{CC}$" to --$I_{CC}$,--.

In column 6 at line 67, Change "$V_{CNTL}$," to --$V_{CNTL}$--.

In column 7 at line 3, Change "$\Phi$" to --$(\Phi)$--.

In the Claims

In column 10 at line 31, In Claim 1, change "look-up" to --a look-up--.

In column 12 at line 1, In Claim 12, change "3" to --2--.

In column 12 at line 26, In Claim 16, change "look- up" to --look-up--.

Signed and Sealed this  
Twenty-fourth Day of June, 2014

Michelle K. Lee  
*Deputy Director of the United States Patent and Trademark Office*